United States Patent
Ban (10) Patent No.: US 10,643,049 B2
(45) Date of Patent: May 5, 2020

(54) DISPLAY SUBSTRATE, MANUFACTURING METHOD THEREOF, DISPLAY DEVICE AND FINGERPRINT IDENTIFICATION METHOD

(71) Applicant: BOE TECHNOLOGY GROUP CO., LTD., Beijing (CN)

(72) Inventor: Shengguang Ban, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 74 days.

(21) Appl. No.: 15/989,018

(22) Filed: May 24, 2018

(65) Prior Publication Data

US 2019/0205591 A1 Jul. 4, 2019

(30) Foreign Application Priority Data

Jan. 2, 2018 (CN) .......................... 2018 1 0002328

(51) Int. Cl.
  *G06K 9/00* (2006.01)
  *H01L 41/113* (2006.01)
  *G01L 1/16* (2006.01)
  *H01L 41/047* (2006.01)

(52) U.S. Cl.
  CPC .............. *G06K 9/0002* (2013.01); *G01L 1/16* (2013.01); *G06K 9/00087* (2013.01); *H01L 41/1132* (2013.01); *H01L 41/047* (2013.01)

(58) Field of Classification Search
  CPC .... G06K 9/0002; G06K 9/00087; G01L 1/16; H01L 41/1132
  See application file for complete search history.

(56) References Cited

U.S. PATENT DOCUMENTS

| 2011/0037732 A1* | 2/2011 | Takama | G06F 3/0412 345/175 |
| 2012/0032911 A1* | 2/2012 | Jung | G06F 3/0412 345/174 |
| 2013/0051524 A1* | 2/2013 | Sato | A61B 6/5205 378/62 |
| 2015/0022501 A1* | 1/2015 | Kita | G02F 1/13338 345/174 |

(Continued)

FOREIGN PATENT DOCUMENTS

| CN | 105139793 A | 12/2015 |
| CN | 106020553 A | 10/2016 |

(Continued)

OTHER PUBLICATIONS

First Chinese Office Action dated Dec. 23, 2019, received for corresponding Chinese Application No. 201810002328.5, 23 pages.

*Primary Examiner* — Utpal D Shah
(74) *Attorney, Agent, or Firm* — Kinney & Lange, P.A.

(57) ABSTRACT

The present disclosure provides a display substrate, a manufacturing method thereof, a display device and a fingerprint identification method. The display substrate includes a fingerprint identification module. The fingerprint identification module is arranged at a display region of the display substrate, and includes a plurality of sensors arranged in an array form, a plurality of scanning lines, and a plurality of detection lines crossing the scanning lines. Each sensor is arranged at an intersection of one scanning line and a corresponding detection line.

19 Claims, 6 Drawing Sheets

(56) References Cited

U.S. PATENT DOCUMENTS

| | | | |
|---|---|---|---|
| 2015/0220212 A1* | 8/2015 | Kim | G06F 3/0421 |
| | | | 345/175 |
| 2016/0132713 A1* | 5/2016 | Bae | G06F 3/0412 |
| | | | 345/174 |
| 2016/0266695 A1* | 9/2016 | Bae | G06F 1/1643 |
| 2017/0351364 A1* | 12/2017 | Kim | G06F 3/0416 |
| 2017/0371213 A1 | 12/2017 | Wang et al. | |
| 2018/0211079 A1 | 7/2018 | Liu et al. | |
| 2018/0247099 A1 | 8/2018 | Liu et al. | |
| 2018/0254288 A1 | 9/2018 | Ling et al. | |
| 2018/0321783 A1 | 11/2018 | Guo et al. | |
| 2019/0065811 A1 | 2/2019 | Cao et al. | |

FOREIGN PATENT DOCUMENTS

| | | | |
|---|---|---|---|
| CN | 106095211 A | 11/2016 | |
| CN | 106169484 A | 11/2016 | |
| CN | 106250834 A | 12/2016 | |
| CN | 106355136 A | 1/2017 | |
| CN | 106557741 A | 4/2017 | |
| CN | 107194384 A | 9/2017 | |
| CN | 107526474 A | 12/2017 | |

\* cited by examiner

DISPLAY SUBSTRATE, MANUFACTURING METHOD THEREOF, DISPLAY DEVICE AND FINGERPRINT IDENTIFICATION METHOD

CROSS-REFERENCE TO RELATED APPLICATION

The present application claims a priority of the Chinese patent application No. 201810002328.5 filed on Jan. 2, 2018, which is incorporated herein by reference in its entirety.

BACKGROUND

The present disclosure relates generally to the field of fingerprint identification technology, and more particularly to a display substrate, a manufacturing method thereof, a display device and a fingerprint identification method.

Due to their life-long invariance, uniqueness and convenience, fingerprints have almost become a byword for biometric feature recognition. Currently, more and more display devices, especially mobile display devices (e.g., mobile phones and flat-panel computers), are provided with a fingerprint identification function. It is necessary to reserve a separate position or space at a front face or back face of the display device for a fingerprint identification module, so it is almost impossible to provide a narrow-bezel, light and thin product.

SUMMARY

In one aspect, the present disclosure provides in some embodiments a display substrate, including a fingerprint identification module. The fingerprint identification module is arranged at a display region of the display substrate, and includes a plurality of sensors arranged in an array form, a plurality of scanning lines, and a plurality of detection lines crossing the scanning lines. Each sensor is arranged at an intersection of one scanning line and a corresponding detection line.

In a possible embodiment of the present disclosure, the plurality of sensors includes one or more of pressure sensors, optical sensors, infrared sensors and ultrasonic sensors.

In a possible embodiment of the present disclosure, the pressure sensor includes a first electrode layer, a piezoelectric material layer and a second electrode layer superimposed one on another, each scanning line is connected to the first electrode layer of the corresponding pressure sensor, and each detection line is connected to the second electrode layer of the corresponding pressure sensor.

In a possible embodiment of the present disclosure, each scanning line is arranged in a same layer and in a same material as the first electrode layer, and each detection line is arranged in a same layer and in a same material as the second electrode layer.

In a possible embodiment of the present disclosure, the fingerprint identification module completely covers the display region of the display substrate.

In a possible embodiment of the present disclosure, the fingerprint identification module partially covers the display region of the display substrate.

In a possible embodiment of the present disclosure, the display region of the display substrate includes a pixel region and a non-pixel region, and the plurality of sensors is arranged at the non-pixel region.

In a possible embodiment of the present disclosure, the non-pixel region surrounds the pixel region, a black matrix is arranged at the non-pixel region, and the plurality of sensors, the plurality of scanning lines and the plurality of detection lines are arranged at the non-pixel region.

In a possible embodiment of the present disclosure, the display substrate further includes a base substrate and a display function layer arranged at a first side of the base substrate, and the fingerprint identification module is arranged at a second side of the base substrate opposite to the first side.

In another aspect, the present disclosure provides in some embodiments a display panel, including a display substrate and a fingerprint identification module attached to a side of the display substrate facing a display side. The fingerprint identification module is arranged at a display region of the display substrate, and includes a plurality of sensors arranged in an array form, a plurality of scanning lines, and a plurality of detection lines crossing the scanning lines. Each sensor includes a first electrode layer, a piezoelectric material layer and a second electrode layer superimposed one on another. Each sensor is arranged at an intersection of one scanning line and a corresponding detection line.

In a possible embodiment of the present disclosure, each scanning line is connected to the first electrode layer of the corresponding pressure sensor, and each detection line is connected to the second electrode layer of the corresponding pressure sensor.

In a possible embodiment of the present disclosure, each scanning line is arranged in a same layer and in a same material as the first electrode layer, and each detection line is arranged in a same layer and in a same material as the second electrode layer.

In a possible embodiment of the present disclosure, the fingerprint identification module completely covers the display region of the display substrate.

In a possible embodiment of the present disclosure, the display region of the display substrate includes a pixel region and a non-pixel region, and the plurality of sensors is arranged at the non-pixel region.

In a possible embodiment of the present disclosure, the display substrate further includes a base substrate and a display function layer arranged at a first side of the base substrate, and the fingerprint identification module is arranged at a second side of the base substrate opposite to the first side.

In yet another aspect, the present disclosure provides in some embodiments a display device including the above-mentioned display panel, and a fingerprint identification circuit configured to scan predetermined scanning lines in a progressive manner, read detection signals from predetermined detection lines, and acquire a fingerprint detection result in accordance with the detection signals. The predetermined scanning lines are at least parts of the plurality of scanning lines, and the predetermined detection lines are at least parts of the plurality of detection lines.

In a possible embodiment of the present disclosure, the display device further includes a first control circuit configured to, in the case that the display device is in a screen-off state or a screen locking state, control the fingerprint identification circuit to scan all the scanning lines in a progressive manner and read the detection signals from all the detection lines, and in the case that the display device is in a screen unlocking state, control the fingerprint identification circuit to scan the predetermined scanning lines at the display region in a progressive manner and read the detection signals from the predetermined detection lines at the display region.

In a possible embodiment of the present disclosure, the display device further includes: a vibration sensor configured to detect whether or not the display device in an active state; and a second control circuit configured to, in the case that the display device is in the active state, enable the fingerprint identification circuit, and in the case that the display device is in an inactive state, disenable the fingerprint identification circuit.

In still yet another aspect, the present disclosure provides in some embodiments a fingerprint identification method for use in the above-mentioned display device, including steps of: scanning predetermined scanning lines in a progressive manner, and reading detection signals from predetermined detection lines; and acquiring a fingerprint detection result in accordance with the detection signals. The predetermined scanning lines are at least parts of the plurality of scanning lines, and the predetermined scanning lines are at least parts of the plurality of detection lines.

In a possible embodiment of the present disclosure, the fingerprint identification method further includes applying voltages to the scanning lines and the detection lines at four corner sub-regions of the display region, and not applying voltages to the scanning lines and the detection lines at the other sub-region of the display region.

BRIEF DESCRIPTION OF THE DRAWINGS

In order to illustrate the technical solutions of the present disclosure or the related art in a clearer manner, the drawings desired for the present disclosure or the related art will be described hereinafter briefly. The following drawings merely relate to some embodiments of the present disclosure, and based on these drawings, a person skilled in the art may obtain other embodiments without creative effort.

DETAILED DESCRIPTION

In order to make the objects, the technical solutions, and the advantages of the present disclosure more apparent, the present disclosure will be described hereinafter in a clear and complete manner in conjunction with the drawings and embodiments. The following embodiments merely relate to a part of, rather than all of, the embodiments of the present disclosure, and based on these embodiments, a person skilled in the art may, without creative effort, obtain additional embodiments which also fall within the scope of the present disclosure.

Figure 1:
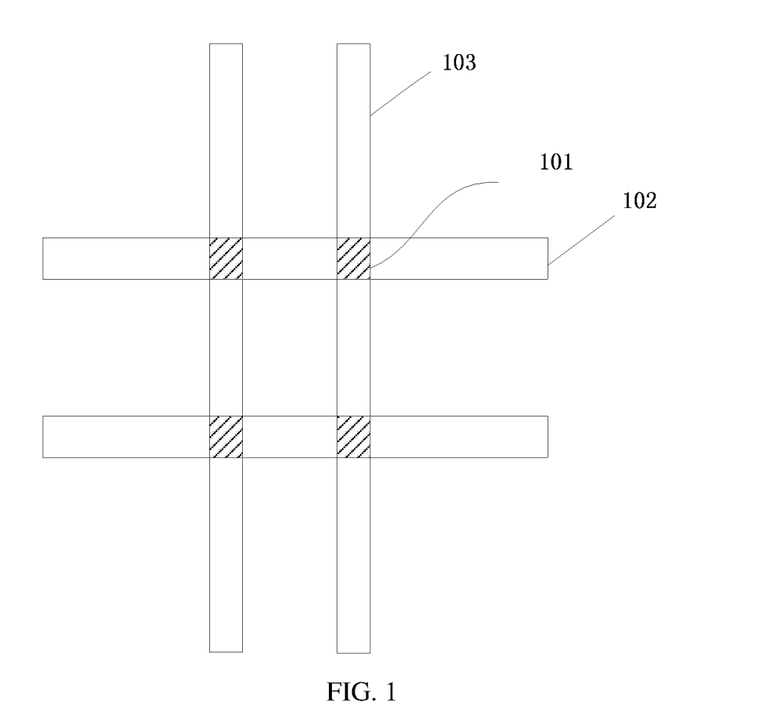
FIG. 1 is a schematic view showing a display substrate according to one embodiment of the present disclosure.

In the related art, it is necessary for a display device to reserve a separate position or space for a fingerprint identification module, so it is almost impossible to provide a narrow-bezel, light and thin product. In order to solve this problem, the present disclosure provides in some embodiments a display substrate. The fingerprint identification module is arranged at a display region of the display substrate, and includes, as shown in FIG. 1, a plurality of fingerprint identification sensors 101 arranged in an array form, a plurality of scanning lines 102, and a plurality of detection lines 103 crossing the scanning lines 102.

In the embodiments of the present disclosure, each scanning line 102 is connected to the fingerprint identification sensors 101 in a corresponding row, and each detection line 103 is connected to the fingerprint identification sensors 101 in a corresponding column. In other words, the scanning lines 102 extend in a transverse direction (i.e., a horizontal direction in FIG. 1), and the detection lines 103 extend in a longitudinal direction (i.e., a vertical direction in FIG. 1).

Of course, in some other embodiments of the present disclosure, each scanning line may be connected to the fingerprint identification sensors in a corresponding column, and each detection line may be connected to the fingerprint identification sensors in a corresponding row. In other words, the scanning lines extend in the longitudinal direction (i.e., the vertical direction in FIG. 1), and the detection lines extend in the transverse direction (i.e., the horizontal direction in FIG. 1).

According to the display substrate in the embodiments of the present disclosure, the fingerprint identification module is integrated into the display substrate and arranged at the display region of the display substrate, so the fingerprint identification may be performed at the display region of the display substrate in accordance with the practical need. As a result, it is able to improve the user experience and improve a screen-to-body ratio of a display screen without any necessary to reserve a separate position or space for the fingerprint identification module, thereby to provide a narrow-bezel, light and thin product.

The fingerprint identification sensor 101 may be of various types. In a possible embodiment of the present disclosure, the fingerprint identification sensor 101 may perform the fingerprint identification on the basis of a piezoelectric effect.

Figure 2:
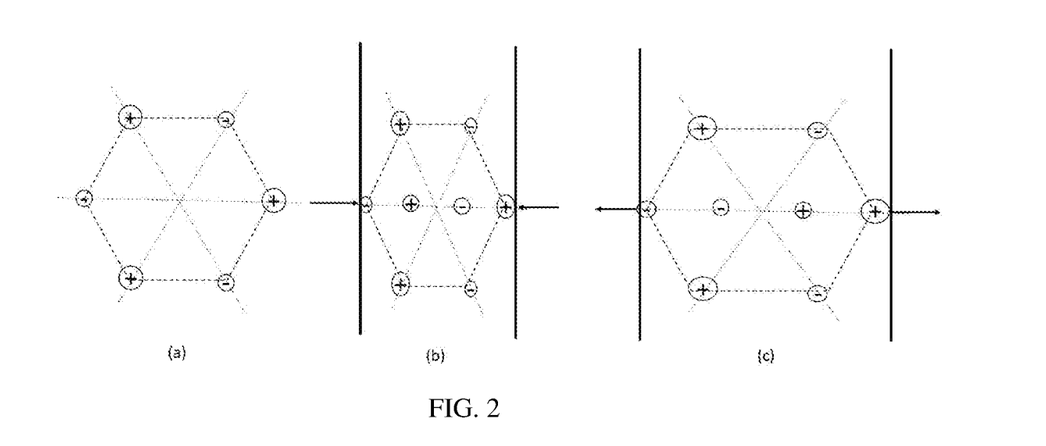
FIG. 2 is a schematic view showing a principle of a piezoelectric effect of a piezoelectric material.

The piezoelectric effect will be described hereinafter briefly with reference to FIG. 2. In the case that an external force is applied to a piezoelectric material in a certain direction, the displacement of a center of mass of all positive ions and a center of mass of all negative ions inside the piezoelectric material may occur, and the piezoelectric material may be polarized, so bound charges may occur at two opposite surfaces of the piezoelectric material. A density of the bound charges is in direct proportion to the applied force, and this phenomenon is called as "piezoelectric effect". Referring to FIG. 2, in the case that no force is applied to the piezoelectric material, positive and negative ions in the piezoelectric material are arranged in accordance with a lattice, and the center of mass of all positive ions coincides with the center of mass of all negative ions. At this time, no charge is generated at a surface of the piezoelectric material, and the piezoelectric material is electroneutral, as shown in FIG. 2(*a*). In the case that a pressure stress or tensile stress is applied to the piezoelectric material, as shown in FIG. 2(*b*) and FIG. 2(*c*), generally an electric dipole moment is formed due to the deformation of the lattice, so the charges are generated at the surface of the piezoelectric material and a surface charge density is in direct proportion to the external stress. A potential may be generated between the positive charges and the negative charges on the surfaces of the piezoelectric material, so mechanical energy generated due to a pressing operation may be converted into an electrical signal. Based on the above principle, it is able to perform the fingerprint identification in accordance with different forces applied by ridges and valleys of a fingerprint during the pressing operation. Through the piezoelectric effect, it is able to perform the fingerprint identification sensitively. In addition, because the piezoelectric material is capable of generating the charges through the pressing operation, it is unnecessary to provide an individual operating voltage to the fingerprint identification sensor, and thereby it is able to reduce the power consumption.

Figure 3:
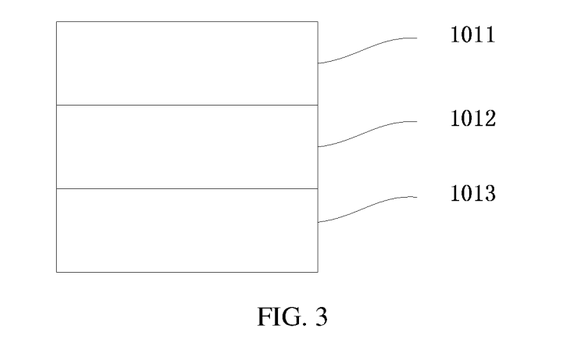
FIG. 3 is a sectional view of a fingerprint identification sensor according to one embodiment of the present disclosure.

Referring to FIG. 3, in a possible embodiment of the present disclosure, each fingerprint identification sensor may include a first electrode layer 1011, a piezoelectric material layer 1012 and a second electrode layer 1013 superimposed one on another. Each scanning line is connected to the first electrode layer 1011 of the corresponding fingerprint identification sensor, and each detection line is connected to the second electrode layer 1013 of the corresponding fingerprint identification sensor. Here, the fingerprint identification sensor 101 just performs the fingerprint identification on the basis of the piezoelectric effect.

In a possible embodiment of the present disclosure, each scanning line is arranged in a same layer and in a same material as the first electrode layer, and each detection line is arranged in a same layer and in a same material as the second electrode layer. In this way, the scanning lines and the first electrode layer may be formed through a single patterning process, and the detection lines and the second electrode layer may be formed through a single patterning process, so it is able to reduce the number of masks used during the manufacture, thereby to reduce the manufacture cost.

In a possible embodiment of the present disclosure, the fingerprint identification module may completely cover the display region of the display substrate, so as to achieve the fingerprint identification function at the entire display region of the display substrate, thereby to improve the user experience. Of course, in some other possible embodiments of the present disclosure, the fingerprint identification module may merely partially cover the display region of the display substrate, so as to reduce the manufacture cost.

Figure 4:
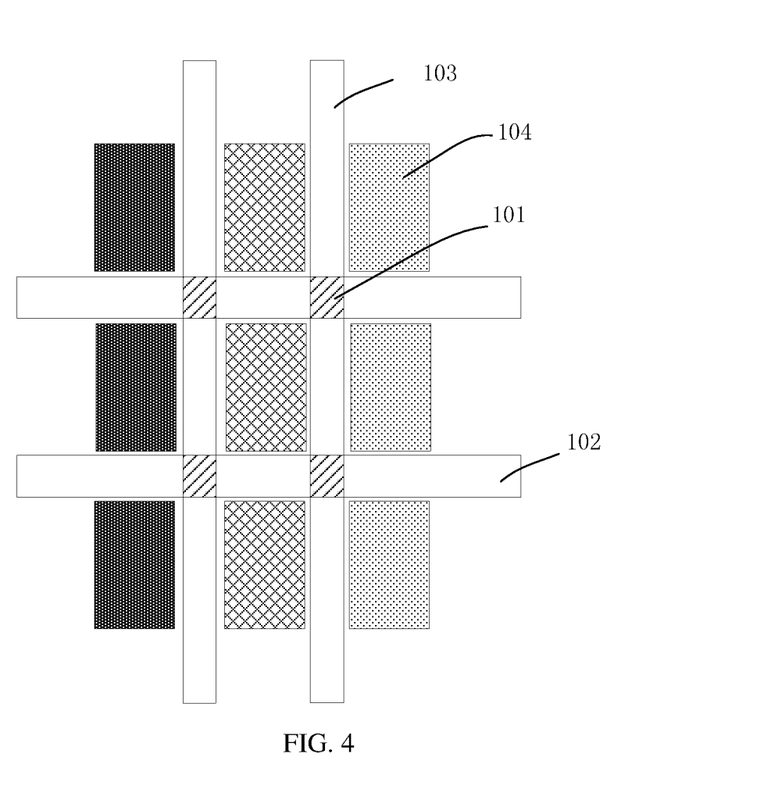
FIG. 4 is another schematic view showing the display substrate according to one embodiment of the present disclosure.

In a possible embodiment of the present disclosure, the display region of the display substrate includes a pixel region and a non-pixel region. The fingerprint identification sensors are arranged at the non-pixel region, so as to achieve the fingerprint identification function with an aperture ratio of the display substrate being not adversely affected. Referring to FIG. 4, a rectangular region indicated by 104 is just the pixel region, and a region surrounding the pixel region is just the non-pixel region. A light-shielding material layer, e.g., a black matrix, is arranged at the non-pixel region. In addition, the fingerprint identification sensors 101, the scanning lines 102 and the detection lines 103 are also arranged at the non-pixel region.

In FIG. 4, four fingerprint identification sensors 101 surround each subpixel, so as to improve the fingerprint identification accuracy as well as the security. Of course, in some other possible embodiments of the present disclosure, the number of the fingerprint identification sensors 101 may be set in accordance with the practical need, so as to reduce the manufacture cost.

In the embodiments of the present disclosure, the display substrate may further include a base substrate and a display function layer arranged at a first side of the base substrate. For example, in the case that the display substrate is a color filter substrate, the display function layer includes a color filter layer, the black matrix, and a protection layer, and so on. In a possible embodiment of the present disclosure, the fingerprint identification module is arranged at a second side of the base substrate opposite to the first side. Because the fingerprint identification module is arranged at a side of the display substrate facing a display side, it is able to provide the fingerprint identification module closer to the fingerprint, thereby to improve the fingerprint identification accuracy.

In addition, in the case that the fingerprint identification module is arranged at the second side of the base substrate, the display substrate may further include a protection layer covering the fingerprint identification module and configured to protect the fingerprint identification module. The protection layer needs to have certain rigidity and a certain insulation capability, so as to facilitate the transmission of a pressure onto the fingerprint identification sensor.

Of course, in some other possible embodiments of the present disclosure, the fingerprint identification module may also be arranged at the first side of the display substrate, i.e., at a same side as the display function layer of the display substrate.

In the embodiments of the present disclosure, the display substrate may be used for a liquid crystal display device or an organic light-emitting diode (OLED) display device. In the case that the display substrate is used for the liquid crystal display device, the display substrate may be a color filter substrate. In the case that the display substrate is used for the OLED display device, the display substrate may be an encapsulation cover plate. In this way, it is able to provide the fingerprint identification module closer to the fingerprint, thereby to improve the fingerprint identification accuracy.

The present disclosure further provides in some embodiments a display panel including the above-mentioned display substrate.

In the embodiments of the present disclosure, the display panel may be a liquid crystal display panel or an OLED display panel. In the case that the display panel is the liquid crystal display panel, it may include an array substrate and a color filter substrate, and at this time, the display substrate may be the color filter substrate. In the case that the display panel is the OLED display panel, it may include an OLED display substrate and an encapsulation cover plate for encapsulating the OLED display substrate, and at this time, the display substrate may be the encapsulation cover plate. In this way, it is able to provide the fingerprint identification module closer to the fingerprint, thereby to improve the fingerprint identification accuracy.

In a possible embodiment of the present disclosure, the fingerprint identification module is integrated into, and manufactured together with, the display substrate. Of course, in some other possible embodiments of the present disclosure, the fingerprint identification module may also be manufactured separately, and then attached onto the display substrate.

The present disclosure further provides in some embodiments a display panel including a display substrate and a fingerprint identification module attached onto a side of the display substrate facing a display side. The fingerprint identification module is arranged at a display region of the display substrate, and includes a plurality of fingerprint identification sensors arranged in an array form, a plurality of scanning lines, and a plurality of detection lines crossing the scanning lines. Each scanning line is connected to the fingerprint identification sensors in a corresponding row and each detection line is connected to the fingerprint identification sensors in a corresponding column, or each scanning line is connected to the fingerprint identification sensors in a corresponding column and each detection line is connected to the fingerprint identification sensors in a corresponding row.

According to the display panel in the embodiments of the present disclosure, the fingerprint identification module is attached onto the display panel and arranged at the display region of the display panel, so the fingerprint identification may be performed at the display region of the display panel in accordance with the practical need. As a result, it is able to improve the user experience and improve a screen-to-body ratio of a display screen without any necessary to reserve a separate position or space for the fingerprint identification module, thereby to provide a narrow-bezel, light and thin product.

The fingerprint identification sensor may be of various types. In a possible embodiment of the present disclosure, the fingerprint identification sensor may perform the fingerprint identification on the basis of a piezoelectric effect.

In a possible embodiment of the present disclosure, each fingerprint identification sensor may include a first electrode layer, a piezoelectric material layer and a second electrode layer superimposed one on another. Each scanning line is connected to the first electrode layer of the corresponding fingerprint identification sensor, and each detection line is connected to the second electrode layer of the corresponding fingerprint identification sensor. Here, the fingerprint identification sensor just performs the fingerprint identification on the basis of the piezoelectric effect.

In a possible embodiment of the present disclosure, each scanning line is arranged in a same layer and in a same material as the first electrode layer, and each detection line is arranged in a same layer and in a same material as the second electrode layer. In this way, the scanning lines and the first electrode layer may be formed through a single patterning process, and the detection lines and the second electrode layer may be formed through a single patterning process, so it is able to reduce the number of masks used during the manufacture, thereby to reduce the manufacture cost.

Figure 5:
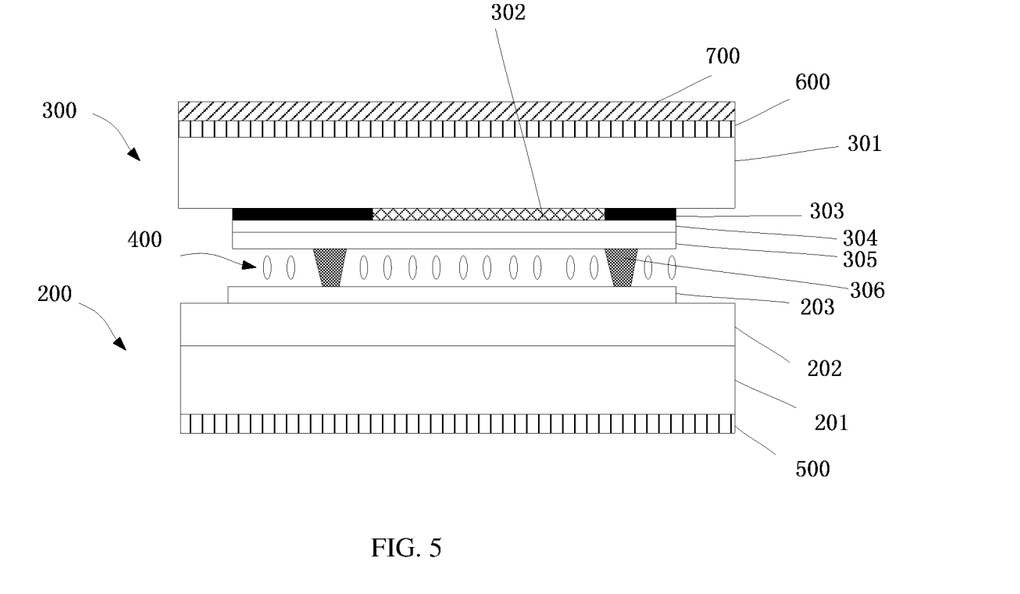
FIG. 5 is a schematic view showing a display panel according to one embodiment of the present disclosure.

Referring to FIG. 5, the display panel includes an array substrate 200, a color filter substrate 300, a liquid crystal layer 400 arranged between the array substrate 200 and the color filter substrate 300, a polarizer 500 arranged on the array substrate 200, a polarizer 600 arranged on the color filter substrate 300, and a fingerprint identification module 700 arranged at a side of the polarizer 600 facing a display side of the display panel. The array substrate 200 includes a base substrate 201, and a thin film transistor (TFT) driving layer 202 and an alignment layer 203 arranged on the base substrate 201. The color filter substrate 300 includes a base substrate 301, and a color filter layer 302, a black matrix 303, a planarization layer 304, an alignment layer 305 and a spacer 306 arranged on the base substrate 301 respectively.

In a possible embodiment of the present disclosure, the fingerprint identification module 700 is arranged at an outermost side of the display panel, so as to provide the fingerprint identification module 700 closer to the fingerprint, thereby to improve the fingerprint identification accuracy. In addition, fingerprint identification sensors, scanning lines and detection lines of the fingerprint identification module 700 are arranged at a region where the black matrix 303 is located, so as to achieve the fingerprint identification function with an aperture ratio of the display panel being not adversely affected.

The present disclosure further provides in some embodiments a display device including the above-mentioned display panel, and a fingerprint identification circuit configured to scan predetermined scanning lines in a progressive manner, read detection signals from predetermined detection lines, and acquire a fingerprint detection result in accordance with the detection signals. The predetermined scanning lines are at least parts of the plurality of scanning lines, and the predetermined detection lines are at least parts of the plurality of detection lines.

According to the display device in the embodiments of the present disclosure, the fingerprint identification module is arranged at the display region of the display substrate, so the fingerprint identification may be performed at the display region of the display substrate in accordance with the practical need. As a result, it is able to improve the user experience and improve a screen-to-body ratio of a display screen without any necessary to reserve a separate position or space for the fingerprint identification module, thereby to provide a narrow-bezel, light and thin product.

Figure 6:
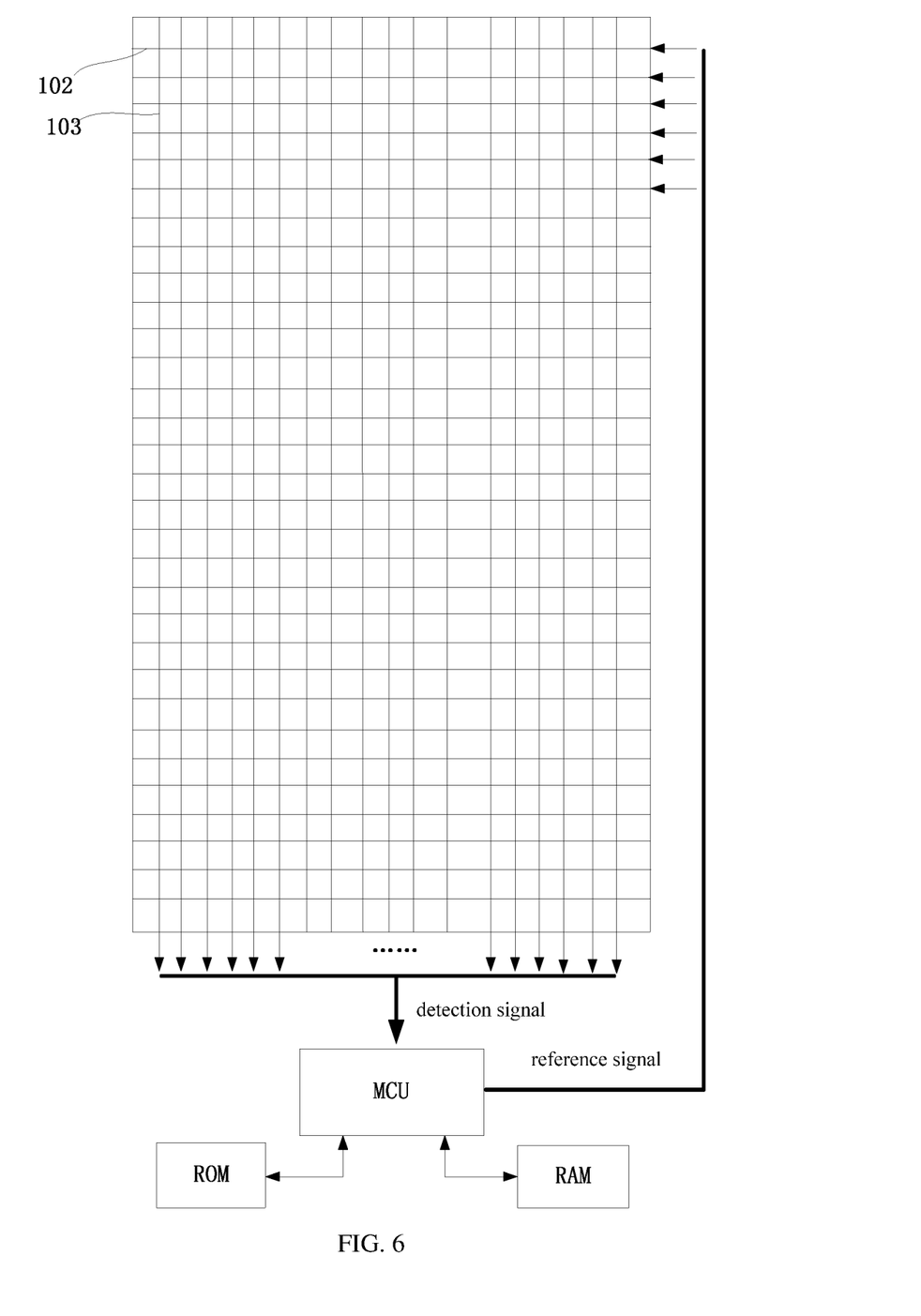
FIG. 6 is yet another schematic view showing the display substrate according to one embodiment of the present disclosure.

In a possible embodiment of the present disclosure, as shown in FIG. 6, the fingerprint identification circuit may include a microcontroller unit (MCU) with a computational function, a random access memory (RAM) and a read-only memory (ROM). The MCU is configured to scan the predetermined scanning lines 102 in a progressive manner, and read the detection signals from the predetermined detection lines 103. The RAM is configured to temporarily store therein the fingerprint identification result. The ROM is configured to store therein a plurality of sets of fingerprint eigenvalue sequences of a user. After the piezoelectric material has been pressed, a generated electrical signal may be relatively weak. In order to amplify the electrical signal, the MCU may output a reference signal to the predetermined scanning lines in a progressive manner.

In a possible embodiment of the present disclosure, the predetermined scanning lines may be all or parts of the plurality of scanning lines, and the predetermined detection lines may be all or parts of the plurality of detection lines. In the case that the predetermined scanning lines are all of the plurality of scanning lines and the predetermined detection lines are all of the plurality of detection lines, it is able to achieve the fingerprint identification function at the entire display region of the display device. In addition, in the case that the predetermined scanning lines are parts of the plurality of scanning lines or the predetermined detection lines are parts of the plurality of detection lines, it is able to achieve the fingerprint identification function at a part of the display region of the display device. In other words, it is able to achieve the fingerprint identification function at the entire or a part of the display region in accordance with the practical need, thereby to improve the user experience. For example, in order to prevent the fingerprint identification function from being triggered unexpectedly, it is able to configure the fingerprint identification function merely at a predetermined sub-region, e.g., four corner sub-regions, of the display region. At this time, voltages are applied to the scanning lines and the detection lines at the four corner sub-regions, and no voltage is applied to the scanning lines and the detection lines at the other sub-regions.

Figure 8:
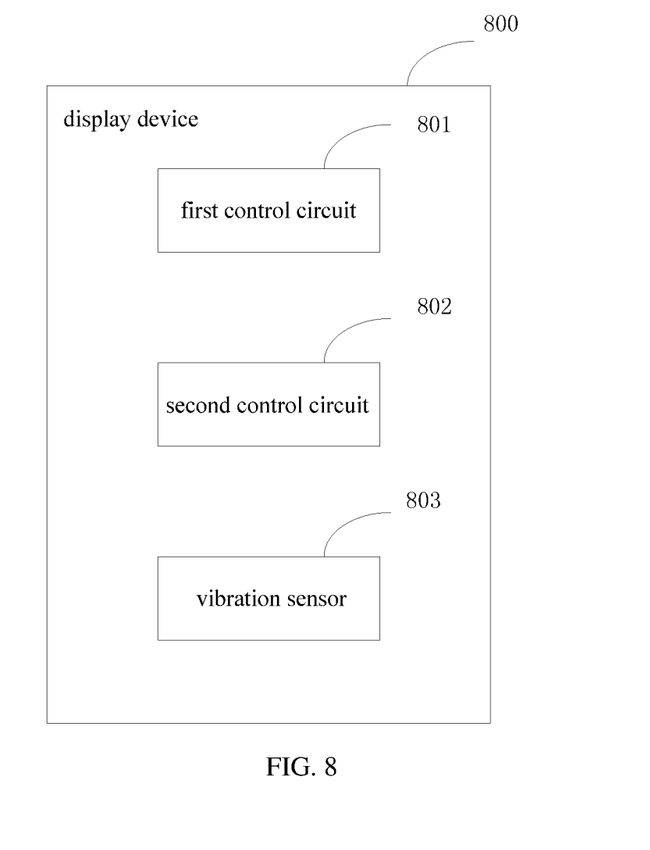
FIG. 8 is a block diagram of the display device 800 according to another embodiment of the present disclosure.

In a possible embodiment of the present disclosure, as shown in FIG. 8, the display device 800 may further include a first control circuit 801 configured to, in the case that the display device 800 is in a screen-off state or a screen locking state, control the fingerprint identification circuit to scan all the scanning lines in a progressive manner and read the detection signals from all the detection lines, and in the case that the display device 800 is in a screen unlocking state, control the fingerprint identification circuit to scan the predetermined scanning lines at the display region in a progressive manner and read the detection signals from the predetermined detection lines at the display region. In other words, a full-screen fingerprint identification function is merely enabled in the case that the display device is in the screen-off or screen locking state. After a screen is turned on and unlocked, the fingerprint identification function may be enabled at a predetermined region in accordance with the user's preference, e.g., at the bottom of a screen. In this way, it is able to reduce the power consumption of the display device, prevent the occurrence of crosstalk, and prevent the fingerprint identification function from being triggered unexpectedly.

In a possible embodiment of the present disclosure, the display device may further include: a vibration sensor 803 configured to detect whether or not the display device 800 is in an active state; and a second control circuit 802 configured to, in the case that the display device 800 is in the active state, enable the fingerprint identification circuit to scan the predetermined scanning lines in a progressive manner and read the detection signals from the predetermined detection lines, and in the case that the display device 800 is in an inactive state, disenable the fingerprint identification circuit. In this way, in the case that the display device 800 is in the active state, the fingerprint identification circuit is enabled, and in the case that the display device 800 is in the inactive state, the fingerprint identification circuit is disenabled, so as to reduce the power consumption of the display device 800 in a standby mode. The vibration sensor 803 may include an acceleration sensor and/or a gyroscope, and it may determine whether or not the display device 800 is in the active state through vibration detection.

In the embodiments of the present disclosure, the display device may be a mobile phone, a flat-panel computer, or the like.

The present disclosure further provides in some embodiments a fingerprint identification method for use in the above-mentioned display device, including: Step 11 of scanning predetermined scanning lines in a progressive manner, and reading detection signals from predetermined detection lines; and Step 12 of acquiring a fingerprint detection result in accordance with the detection signals. The predetermined scanning lines are at least parts of the plurality of scanning lines, and the predetermined detection lines are at least parts of the plurality of detection lines.

In a possible embodiment of the present disclosure, the predetermined scanning lines may be all or parts of the plurality of scanning lines, and the predetermined detection lines may be all or parts of the plurality of detection lines. In the case that the predetermined scanning lines are all of the plurality of scanning lines and the predetermined detection lines are all of the plurality of detection lines, it is able to achieve the fingerprint identification function at the entire display region of the display device. In addition, in the case that the predetermined scanning lines are parts of the plurality of scanning lines or the predetermined detection lines are parts of the plurality of detection lines, it is able to achieve the fingerprint identification function at a part of the display region of the display device. In other words, it is able to achieve the fingerprint identification function at the entire or a part of the display region in accordance with the practical need, thereby to improve the user experience. For example, in order to prevent the fingerprint identification function from being triggered unexpectedly, it is able to configure the fingerprint identification function merely at a predetermined sub-region, e.g., four corner sub-regions, of the display region. At this time, voltages are applied to the scanning lines and the detection lines at the four corner sub-regions, and no voltage is applied to the scanning lines and the detection lines at the other sub-regions.

Figure 7:
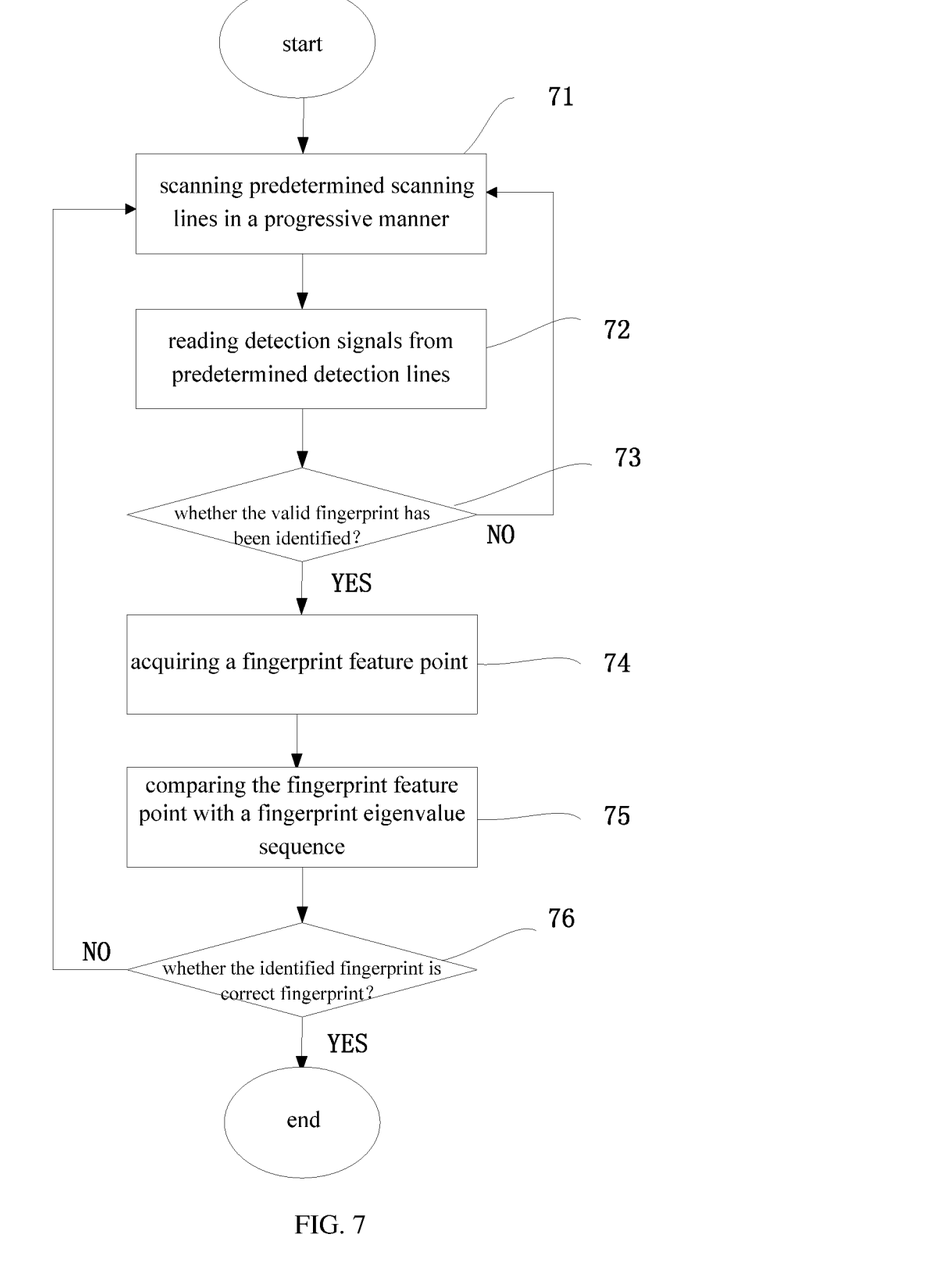
FIG. 7 is a flow chart of a fingerprint identification method according to one embodiment of the present disclosure.

In addition, as shown in FIG. 7, the fingerprint identification method may specifically include the following steps.

Step 71: scanning the predetermined scanning lines in a progressive manner.

Step 72: reading the detection signals from the predetermined detection lines.

Step 73: acquiring the fingerprint detection result in accordance with the detection signals, determining whether or not a valid fingerprint has been identified in accordance with the fingerprint detection result, in the case that the valid fingerprint has been identified, proceeding to Step 74, and otherwise returning to Step 71.

Step 74: acquiring a fingerprint feature point in accordance with the fingerprint detection result.

Step 75: comparing with the acquired fingerprint feature point with a stored fingerprint eigenvalue sequence of a user, so as to acquire a comparison result.

Step 76: determining whether or not the identified fingerprint is a correct fingerprint in accordance with the comparison result, in the case that the identified fingerprint is the correct fingerprint, ending the fingerprint identification procedure, and otherwise returning to Step 71.

In a possible embodiment of the present disclosure, the step of scanning the predetermined scanning lines in a progressive manner and reading the detection signals from the predetermined detection lines may include: in the case that the display device is in a screen-off or screen locking state, scanning all the scanning lines in a progressive manner, and reading the detection signals from all the detection lines; and in the case that the display device is in a screen unlocking state, scanning the predetermined scanning lines at the display region in a progressive manner, and reading the detection signals from the predetermined detection lines at the display region. In other words, a full-screen fingerprint identification function is merely enabled in the case that the display device is in the screen-off or screen locking state. After a screen is turned on and unlocked, the fingerprint identification function may be enabled at a predetermined region in accordance with the user's preference, e.g., at the bottom of a screen. In this way, it is able to reduce the power consumption of the display device, prevent the occurrence of crosstalk, and prevent the fingerprint identification function from being triggered unexpectedly.

In a possible embodiment of the present disclosure, prior to the step of scanning the predetermined scanning lines in a progressive manner and reading the detection signals from the predetermined detection lines, the fingerprint identification method may further include detecting whether or not the display device is in an active state. The step of scanning the predetermined scanning lines in a progressive manner and reading the detection signals from the predetermined detection lines includes: in the case that the display device is in the active state, enabling the fingerprint identification circuit so as to scan the predetermined scanning lines in a progressive manner and read the detection signals from the predetermined detection lines; and in the case that the display device is in the inactive state, disenabling the fingerprint identification circuit. In this way, in the case that the display device is in the active state, the fingerprint identification circuit is enabled, and in the case that the display device is in the inactive state, the fingerprint identification circuit is disenabled, so as to reduce the power consumption of the display device in a standby mode. The vibration sensor may include an acceleration sensor and/or a gyroscope, and it may determine whether or not the display device is in the active state through vibration detection.

The present disclosure further provides in some embodiments a method for manufacturing the above-mentioned display substrate, including a step of forming a fingerprint identification module at a display region of the display substrate. The fingerprint identification module includes a plurality of fingerprint identification sensors arranged in an array form, a plurality of scanning lines, and a plurality of detection lines crossing the scanning lines. Each scanning line is connected to the fingerprint identification sensors in a corresponding row and each detection line is connected to the fingerprint identification sensors in a corresponding column, or each scanning line is connected to the fingerprint identification sensors in a corresponding column and each detection line is connected to the fingerprint identification sensors in a corresponding row.

According to the method in the embodiments of the present disclosure, the fingerprint identification module is arranged at the display region of the display substrate, so the fingerprint identification may be performed at the display region of the display substrate in accordance with the practical need. As a result, it is able to improve the user experience and improve a screen-to-body ratio of a display screen without any necessary to reserve a separate position or space for the fingerprint identification module, thereby to provide a narrow-bezel, light and thin product.

The fingerprint identification sensor may be of various types. In a possible embodiment of the present disclosure, the fingerprint identification sensor may perform the fingerprint identification on the basis of a piezoelectric effect.

In a possible embodiment of the present disclosure, each fingerprint identification sensor may include a first electrode layer, a piezoelectric material layer and a second electrode layer superimposed one on another. Each scanning line is connected to the first electrode layer of the corresponding fingerprint identification sensor, and each detection line is connected to the second electrode layer of the corresponding fingerprint identification sensor. Here, the fingerprint identification sensor just performs the fingerprint identification on the basis of the piezoelectric effect.

In a possible embodiment of the present disclosure, each scanning line is arranged in a same layer and in a same material as the first electrode layer, and each detection line is arranged in a same layer and in a same material as the second electrode layer. In this way, the scanning lines and the first electrode layer may be formed through a single patterning process, and the detection lines and the second electrode layer may be formed through a single patterning process, so it is able to reduce the number of masks used during the manufacture, thereby to reduce the manufacture cost.

In a possible embodiment of the present disclosure, the scanning lines, the detection lines, the first electrode layer and/or the second electrode layer may each be made of a metal material, so as to improve the conductivity. The metal material may be a known metal material for forming a gate metal layer or a source/drain metal layer on an array substrate, e.g., molybdenum (Mo) or copper (Cu). In this way, it is able to manufacture the display substrate in the embodiments of the present disclosure using an existing device, thereby to simplify the manufacture thereof and reduce the manufacture cost.

In a possible embodiment of the present disclosure, the piezoelectric material layer may be made of any piezoelectric material, e.g., a semiconductor piezoelectric material such as zinc oxide (ZnO).

The steps of the method for manufacturing the display substrate will be described hereinafter in more details.

Step 21: providing a base substrate, and forming a display function layer of the display substrate at a first side of the base substrate.

Step 22: forming patterns of the scanning lines and the first electrode layer through a single patterning process at a second side of the base substrate. The scanning lines and the first electrode layer may be made of a known metal material for forming the gate metal layer or the source/drain metal layer on the array substrate.

Step 23: forming a pattern of the piezoelectric material layer at the second side of the base substrate. The piezoelectric material layer may be made of a semiconductor piezoelectric material, e.g., ZnO. To be specific, a piezoelectric material film may be deposited onto the base substrate, and then the pattern of the piezoelectric material layer may be formed through a patterning process.

Step 24: forming patterns of the detection lines and the second electrode layer at the second side of the base substrate through a single patterning process. The detection lines and the second electrode layer may be made of a known metal material for forming the gate metal layer or the source/drain metal layer on the array substrate.

Through the above Steps 22 to 24, it is able to acquire the fingerprint identification module in the embodiments of the present disclosure.

Step 25: forming a protection layer on the fingerprint identification module.

Through the above steps, it is able to acquire the display substrate in the embodiments of the present disclosure.

In the embodiments of the present disclosure, the scanning lines, the detection lines, the first electrode layer, the second electrode layer and the piezoelectric material layer need to be arranged at the non-pixel region of the display region of the display substrate, so as to achieve the fingerprint identification function with an aperture ratio of the display substrate being not adversely affected.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "connect" or "connected to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

The above are merely the preferred embodiments of the present disclosure, but the present disclosure is not limited thereto. Obviously, a person skilled in the art may make further modifications and improvements without departing from the spirit of the present disclosure, and these modifications and improvements shall also fall within the scope of the present disclosure.

The invention claimed is:

1. A display substrate comprising a fingerprint identification module, wherein the fingerprint identification module is arranged at a display region of the display substrate, and comprises a plurality of sensors arranged in an array form, a plurality of scanning lines, and a plurality of detection lines crossing the scanning lines, wherein each sensor is arranged at an intersection of one scanning line and a corresponding detection line,  wherein the plurality of sensors includes one or more pressure sensors, and  wherein each of the one or more pressure sensors comprises a first electrode layer, a piezoelectric material layer and a second electrode layer superimposed one on another, each scanning line is connected to the first electrode layer of a corresponding pressure sensor, and each detection line is connected to the second electrode layer of a corresponding pressure sensor.

2. The display substrate according to claim 1, wherein the plurality of sensors further includes one or more of optical sensors, infrared sensors or ultrasonic sensors.

3. The display substrate according to claim 1, wherein each scanning line is arranged in a same layer and in a same material as the first electrode layer, and each detection line is arranged in a same layer and in a same material as the second electrode layer.

4. The display substrate according to claim 1, wherein the fingerprint identification module completely covers the display region of the display substrate.

5. The display substrate according to claim 1, wherein the fingerprint identification module partially covers the display region of the display substrate.

6. The display substrate according to claim 1, wherein the display region of the display substrate comprises a pixel region and a non-pixel region, and the plurality of sensors is arranged at the non-pixel region.

7. The display substrate according to claim 6, wherein the non-pixel region surrounds the pixel region, a black matrix is arranged at the non-pixel region, and the plurality of sensors, the plurality of scanning lines and the plurality of detection lines are arranged at the non-pixel region.

8. The display substrate according to claim 1, further comprising a base substrate and a display function layer arranged at a first side of the base substrate, wherein the fingerprint identification module is arranged at a second side of the base substrate opposite to the first side.

9. A display panel, comprising a display substrate and a fingerprint identification module attached to a side of the display substrate facing a display side, wherein the fingerprint identification module is arranged at a display region of the display substrate, and comprises a plurality of sensors arranged in an array form, a plurality of scanning lines, and a plurality of detection lines crossing the scanning lines, wherein each sensor comprises a first electrode layer, a piezoelectric material layer and a second electrode layer superimposed one on another, and each sensor is arranged at an intersection of one scanning line and a corresponding detection line.

10. The display panel according to claim 9, wherein each scanning line is connected to the first electrode layer of the corresponding pressure sensor, and each detection line is connected to the second electrode layer of the corresponding pressure sensor.

11. The display panel according to claim 10, wherein each scanning line is arranged in a same layer and in a same material as the first electrode layer, and each detection line is arranged in a same layer and in a same material as the second electrode layer.

12. The display panel according to claim 9, wherein the fingerprint identification module completely covers the display region of the display substrate.

13. The display panel according to claim 9, wherein the display region of the display substrate comprises a pixel region and a non-pixel region, and the plurality of sensors is arranged at the non-pixel region.

14. The display panel according to claim 9, wherein the display substrate further comprises a base substrate and a display function layer arranged at a first side of the base substrate, and the fingerprint identification module is arranged at a second side of the base substrate opposite to the first side.

15. A display device, comprising the display panel according to claim 9, and a fingerprint identification circuit configured to scan predetermined scanning lines in a progressive manner, read detection signals from predetermined detection lines, and acquire a fingerprint detection result in accordance with the detection signals, wherein the predetermined scanning lines are at least parts of the plurality of scanning lines, and the predetermined detection lines are at least parts of the plurality of detection lines.

16. The display device according to claim 15, further comprising a first control circuit configured to, in the case that the display device is in a screen-off state or a screen locking state, control the fingerprint identification circuit to scan all the scanning lines in a progressive manner and read the detection signals from all the detection lines, and in the case that the display device is in a screen unlocking state, control the fingerprint identification circuit to scan the predetermined scanning lines at the display region in a progressive manner and read the detection signals from the predetermined detection lines at the display region.

17. The display device according to claim 15, further comprising: a vibration sensor configured to detect whether or not the display device in an active state; and a second control circuit configured to, in the case that the display device is in the active state, enable the fingerprint identification circuit, and in the case that the display device is in an inactive state, disenable the fingerprint identification circuit.

18. A fingerprint identification method for use in the display device according to claim 15, comprising steps of: scanning predetermined scanning lines in a progressive manner, and reading detection signals from predetermined detection lines; and acquiring a fingerprint detection result in accordance with the detection signals, wherein the predetermined scanning lines are at least parts of the plurality of scanning lines, and the predetermined scanning lines are at least parts of the plurality of detection lines.

19. The fingerprint identification method according to claim 18, further comprising applying voltages to the scanning lines and the detection lines at four corner sub-regions of the display region, and not applying voltages to the scanning lines and the detection lines at the other sub-region of the display region.

\* \* \* \* \*